US012706148B2

(12) United States Patent
Shin et al.

(10) Patent No.: US 12,706,148 B2
(45) Date of Patent: Aug. 11, 2026

(54) SEMICONDUCTOR MEMORY DEVICE FOR PERFORMING BLIND PROGRAM OPERATION AND METHOD OF OPERATING THE SAME

(71) Applicant: SK hynix Inc., Icheon-si (KR)

(72) Inventors: Hyun Seob Shin, Icheon-si (KR); Dong Hun Kwak, Icheon-si (KR); Yeong Jo Mun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 240 days.

(21) Appl. No.: 18/344,677

(22) Filed: Jun. 29, 2023

(65) Prior Publication Data

US 2024/0212760 A1 Jun. 27, 2024

(30) Foreign Application Priority Data

Dec. 23, 2022 (KR) ........................ 10-2022-0182875

(51) Int. Cl.

| | |
|---|---|
| ***G11C 16/10*** | (2006.01) |
| ***G11C 11/56*** | (2006.01) |
| ***G11C 16/08*** | (2006.01) |
| ***G11C 16/34*** | (2006.01) |
| *G06F 12/0882* | (2016.01) |

(Continued)

(52) U.S. Cl.

CPC .............. *G11C 16/10* (2013.01); *G11C 16/08* (2013.01); *G11C 16/3459* (2013.01); *G11C 16/0483* (2013.01)

(58) Field of Classification Search

CPC ..... G11C 16/10; G11C 16/08; G11C 16/3459; G11C 16/0483; G11C 11/5628; G11C 16/34; G11C 16/24; G11C 16/3436; G11C 16/3404; G06F 12/0882

See application file for complete search history.

(56) References Cited

U.S. PATENT DOCUMENTS

2011/0080791 A1* 4/2011 Kim ........................ G11C 16/24 365/185.25

2013/0322171 A1* 12/2013 Lee ........................ G11C 29/04 365/185.03

(Continued)

FOREIGN PATENT DOCUMENTS

KR 1020100029711 A 3/2010

KR 1020210105794 A 8/2021

*Primary Examiner* — Khamdan N. Alrobaie

*Assistant Examiner* — Elizabeth Rose Agger

(74) *Attorney, Agent, or Firm* — WILLIAM PARK AND ASSOCIATES LTD.

(57) ABSTRACT

Provided herein may be a semiconductor memory device and a method of operating the same. By the method, at least one normal program loop is performed on a first memory cell, among a plurality of memory cells included in a page selected as a program target, having an N-th program state, among a plurality of program states, as a target program state, and at least one blind program loop is performed on the first memory cell. While the at least one blind program loop is being performed, a target data pattern that is stored in a data latch of a first page buffer coupled to the first memory cell and that corresponds to the N-th program state is changed to a first data pattern corresponding to a first program state that is lower than the N-th program state, and wherein N is a natural number equal to or greater than 2.

20 Claims, 13 Drawing Sheets

(51) Int. Cl.
*G11C 16/04* (2006.01)
*G11C 16/24* (2006.01)

(56) References Cited

U.S. PATENT DOCUMENTS

| | | | | |
|---|---|---|---|---|
| 2019/0139609 | A1* | 5/2019 | Park | G11C 16/3459 |
| 2022/0172775 | A1* | 6/2022 | Park | G11C 11/5628 |
| 2022/0246633 | A1* | 8/2022 | Arai | G11C 16/0483 |
| 2022/0328113 | A1* | 10/2022 | Hwang | G11C 16/10 |

* cited by examiner

Figure 1:
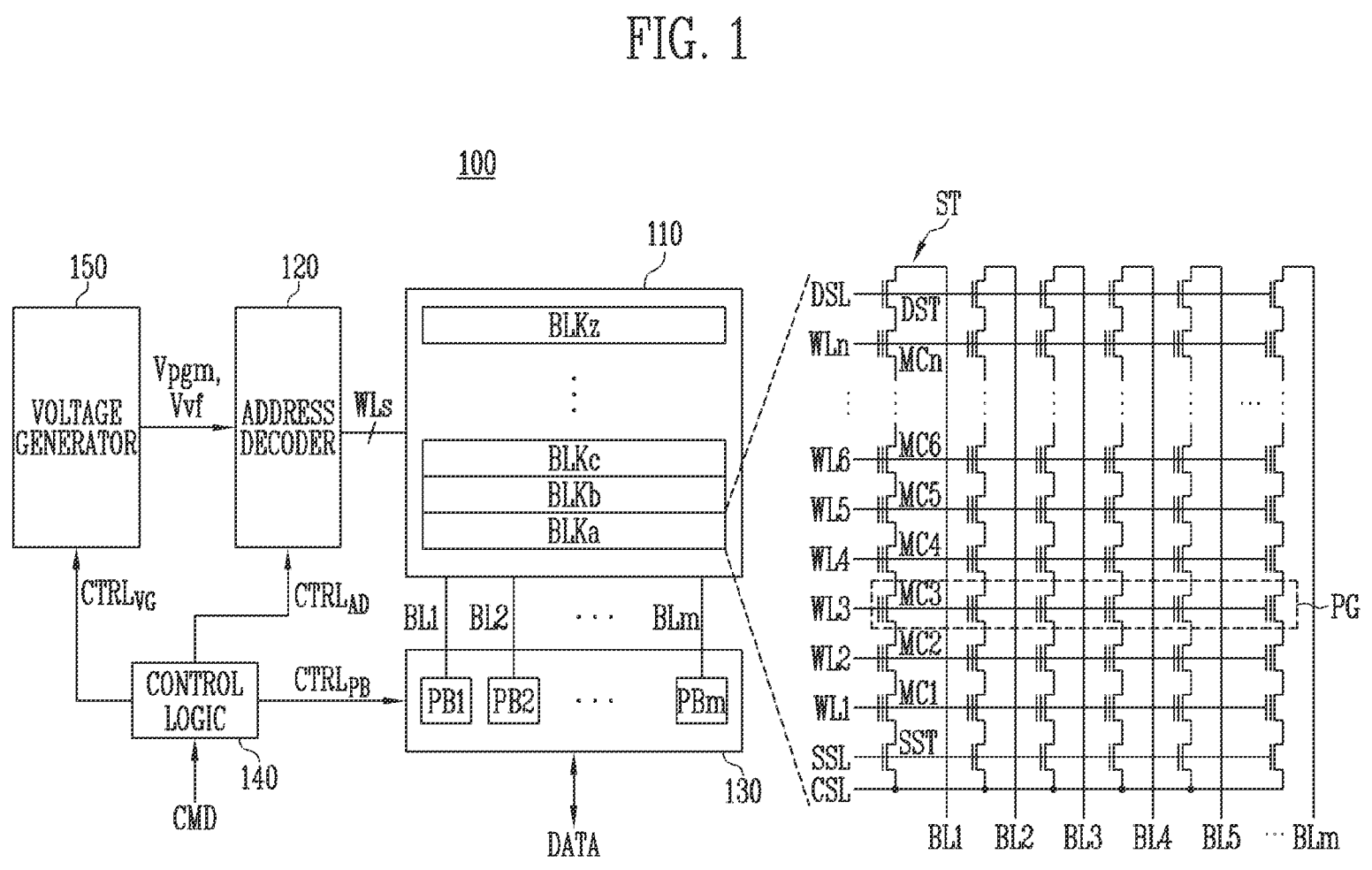

BLKz

BLKc

BLKb

BLKa

120

ADDRESS DECODER

WLs

150

VOLTAGE GENERATOR

Vpgm, Vvf

140

CONTROL LOGIC

CMD $CTRL_{VG}$ $CTRL_{AD}$ $CTRL_{PB}$

130

PB1

PB2

PBm

BL1

BL2

BLm

DATA

ST

PG

DSL

WLn

WL6

WL5

WL4

WL3

WL2

WL1

SSL

CSL

DST

MCn

MC6

MC5

MC4

MC3

MC2

MC1

SST

BL1

BL2

BL3

BL4

BL5

BLm

FIG. 4B

| Vth | LAT1 | LAT2 | LAT3 |
|---|---|---|---|
| Va0 | 0 | 0 | 0 |
| Vb0 | 1 | 1 | 1 |
| Vb1 | 0 | 0 | 0 |
| Vc0 | 0 | 1 | 0 |
| Vc1 | 0 | 0 | 0 |
| Vd0 | 1 | 0 | 0 |
| Vd1 | 0 | 0 | 0 |

| Vth | LAT1 | LAT2 | LAT3 | CLAT1 |
|---|---|---|---|---|
| Vd0 | 1 | 0 | 0 | 0 |
| Vd2 | 1 | 0 | 0 | 0 |
| Vd3 | 1 | 0 | 0 | 1 |
|  | 0 | 0 | 0 | 1 |

S155

| Vth | LAT1 | LAT2 | LAT3 |
|---|---|---|---|
| Vd0 | 1 | 0 | 0 |
| Vd2 | 1 | 1 | 1 |
| Vd3 | 0 | 0 | 0 |

| Vth | LAT1 | LAT2 | LAT3 |
| --- | --- | --- | --- |
| Ve0 | 1 | 0 | 0 |
| Ve1 | 1 | 1 | 1 |
| Ve2 | 1 | 1 | 0 |
| Ve3 | 0 | 1 | 1 |
| Ve4 | 0 | 0 | 0 |

1st Blind PGM
2nd Blind PGM
3rd Blind PGM

SEMICONDUCTOR MEMORY DEVICE FOR PERFORMING BLIND PROGRAM OPERATION AND METHOD OF OPERATING THE SAME

CROSS-REFERENCE TO RELATED APPLICATION

The present application claims priority under 35 U.S.C. § 119(a) to Korean patent application number 10-2022-0182875 filed on Dec. 23, 2022, in the Korean Intellectual Property Office, the entire disclosure of which is incorporated by reference herein.

BACKGROUND

1. Technical Field

Various embodiments of the present disclosure relate to programming of a semiconductor memory device, and more particularly to a semiconductor memory device for performing a blind program operation and a method of operating the semiconductor memory device.

2. Related Art

A memory device may have a two-dimensional (2D) structure in which strings are horizontally arranged on a semiconductor substrate. Alternatively, the memory device may have a three-dimensional (3D) structure in which strings are vertically stacked on a semiconductor substrate. As a memory device having a 2D structure has somewhat reached its physical scaling limit (i.e., limit in the degree of integration), a 3D memory device including a plurality of memory cells vertically stacked on a semiconductor substrate has been produced.

During a program operation on selected memory cells, a plurality of program loops may be performed on the selected memory cells. Each of the program loops may include the step of applying a program voltage to a word line coupled to the selected memory cells and a verify step of sensing whether respective threshold voltages of the selected memory cells are higher than a verify voltage. A blind program operation is characterized in that the above-described verify step is skipped in some program loops. The verify step is skipped in some program loops in which a verify operation is determined to be unnecessary, thus improving the overall program speed.

SUMMARY

An embodiment of the present disclosure may provide for a method of operating a semiconductor memory device. The method may include performing at least one normal program loop on a first memory cell, among a plurality of memory cells included in a page selected as a program target, having an N-th program state, among a plurality of program states, as a target program state, and performing at least one blind program loop on the first memory cell. While the at least one blind program loop is being performed, a target data pattern that is stored in a data latch of a first page buffer coupled to the first memory cell and that corresponds to the N-th program state may be changed to a first data pattern corresponding to a first program state that is lower than the N-th program state among the plurality of program states, and wherein N is a natural number equal to or greater than 2.

An embodiment of the present disclosure may provide for a semiconductor memory device. The semiconductor memory device may include a plurality of memory cells, a plurality of page buffers, and a control logic. Each of the plurality of memory cells may store M bits. The plurality of page buffers may be coupled to the plurality of memory cells through bit lines, respectively, and may be configured to perform a program operation such that a threshold voltage of each of selected memory cells among the plurality of memory cells is included in a corresponding program state among an erase state and first to $(2^M-1)$-th program states. The control logic may be configured to control a first page buffer, among the plurality of page buffers, coupled to a first memory cell corresponding to the $(2^M-1)$-th program state such that, while the program operation is being performed by the plurality of page buffers, a normal program loop is performed on the first memory cell and such that, after the normal program loop is performed, a blind program loop is performed on the first memory cell, wherein M is a natural number equal to or greater than 2.

BRIEF DESCRIPTION OF THE DRAWINGS

FIG. 1 is a diagram for explaining a semiconductor memory device according to an embodiment of the present disclosure.

FIGS. 4A and 4B are diagrams for explaining the threshold voltages of memory cells corresponding to an erase state E and first to seventh program states PV1 to PV7 and data stored in latches.

FIGS. 12A and 12B are diagrams for explaining the threshold voltages of memory cells corresponding to a seventh program state PV7 and data stored in latches during a blind program operation according to an embodiment of the present disclosure.

DETAILED DESCRIPTION

Figure 2:
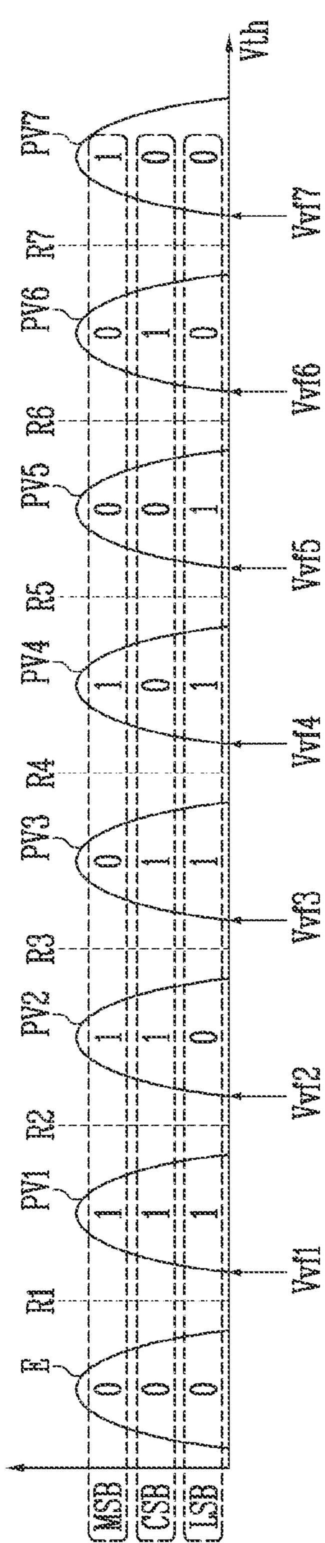
FIG. 2 is a diagram illustrating threshold voltage distributions of triple-level cells (TLC).

Specific structural or functional descriptions in the embodiments of the present disclosure introduced in this specification or application are provided as examples to describe embodiments according to the concept of the present disclosure. The embodiments according to the concept of the present disclosure may be practiced in various forms and should not be construed as being limited to the embodiments described in the specification or application.

Various embodiments of the present disclosure are directed to a semiconductor memory device, which does not require an additional latch for counting the number of blind program operations, and a method of operating the semiconductor memory device.

FIG. 1 is a diagram for explaining a semiconductor memory device according to an embodiment of the present disclosure.

Referring to FIG. 1, a semiconductor memory device 100 may include a memory cell array 110, an address decoder 120, a read and write circuit 130, a control logic 140, and a voltage generator 150.

The memory cell array 110 may include a plurality of memory blocks BLKa to BLKz. The memory blocks BLKa to BLKz may be coupled to the address decoder 120 through word lines WLs. The memory blocks BLKa to BLKz may be coupled to the read and write circuit 130 through bit lines BL1 to BLm. Each of the memory blocks BLKa to BLKz may include a plurality of memory cells. In an embodiment, the plurality of memory cells may be implemented as nonvolatile memory cells.

In FIG. 1, the structure of the memory block BLKa, among the plurality of memory blocks BLKa to BLKz included in the memory cell array, is illustrated. Referring to FIG. 1, a plurality of word lines WL1 to WLn arranged in parallel to each other may be coupled between a drain select line DSL and a source select line SSL. More specifically, the memory block BLKa may include a plurality of strings ST coupled between bit lines BL1 to BLm and a common source line CSL. The bit lines BL1 to BLm may be coupled to the corresponding strings ST, respectively, and the common source line CSL may be coupled in common to the strings ST. Because the strings ST may be equally configured, the string ST coupled to the first bit line BL1 will be described in detail by way of an example.

The string ST may include a source select transistor SST, a plurality of memory cells MC1 to MCn, and a drain select transistor DST that are coupled in series to each other between the common source line CSL and the first bit line BL1. At least one source select transistor SST and at least one drain select transistor DST may be included in one string ST.

A source of the source select transistor SST may be coupled to the common source line CSL, and a drain of the drain select transistor DST may be coupled to the first bit line BL1. The memory cells MC1 to MCn may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells MC1 to MCn may be coupled to a plurality of word lines WL1 to WLn, respectively. A group of memory cells coupled to the same word line, among the memory cells included in different strings ST, may be referred to as a 'physical page (PG)'. Therefore, the memory block BLKa may include a number of physical pages (PG) identical to the number of word lines WL1 to WLn.

One memory cell may store one bit of data. This cell is typically designated as a "single-level cell (SLC)." In this case, one physical page (PG) may store data of one logical page (LPG). The data of one logical page (LPG) may include the same number of data bits as the number of cells included in one physical page (PG).

Meanwhile, one memory cell may store 2 or more bits of data. In this case, one physical page (PG) may store data of two or more logical pages (LPG).

Although, in FIG. 1, the structure of a two-dimensional (2D) memory block is illustrated, the present disclosure is not limited thereto. That is, each of the memory blocks BLKa to BLKz of FIG. 1 may also be implemented as a three-dimensional (3D) memory block.

The address decoder 120, the read and write circuit 130, and the voltage generator 150 may be operated as a peripheral circuit for driving the memory cell array 110. The peripheral circuit may perform a read operation, a program operation, and an erase operation on the memory cell array 110 under the control of the control logic 140. The address decoder 120 may be coupled to the memory cell array 110 through the word lines WLs. The address decoder 120 may be operated under the control of the control logic 140. In detail, the control logic 140 may transfer an address decoding control signal $CTRL_{AD}$ to the address decoder 120, and the address decoder 120 may perform a decoding operation in response to the address decoding control signal $CTRL_{AD}$.

Further, the address decoder 120 may apply a program voltage Vpgm generated by the voltage generator 150 to a selected word line and may apply a program pass voltage to the remaining word lines, that is, unselected word lines, during a program operation. Furthermore, the address decoder 120 may apply a verify voltage Vvf generated by the voltage generator 150 to the selected word line and may apply a verify pass voltage to the remaining word lines, that is, unselected word lines, during a program verify operation.

The read and write circuit 130 may include a plurality of page buffers PB1 to PBm. The read and write circuit 130 may be operated as a "read circuit" during a read operation on the memory cell array 110 and as a "write circuit" during a write operation on the memory cell array 110. The plurality of page buffers PB1 to PBm may be coupled to the memory cell array 110 through the bit lines BL1 to BLm. The read and write circuit 130 may perform a program operation on received data DATA in response to a page buffer control signal $CTRL_{PB}$ output from the control logic 140.

The control logic 140 may be coupled to the address decoder 120, the read and write circuit 130, and the voltage generator 150. The control logic 140 may receive a command CMD from an external device. The control logic 140 may control the address decoder 120, the read and write circuit 130, and the voltage generator 150 to perform an operation corresponding to the received command CMD. That is, the control logic 140 may control the operation of the voltage generator 150 by using a voltage generation control signal $CTRL_{VG}$. Also, the control logic 140 may control the operation of the address decoder 120 by using the address decoding control signal $CTRL_{AD}$. Meanwhile, the control logic 140 may control the operations of the page buffers PB1 to PBm in the read and write circuit 130 by using the page buffer control signal $CTRL_{PB}$.

The voltage generator 150 may generate various operating voltages in response to the voltage generation control signal $CTRL_{VG}$ output from the control logic 140. For example, the voltage generator 150 may generate the program voltage Vpgm used for a program operation and the verify voltage Vvf used for a program verify operation. Furthermore, the voltage generator 150 may generate the program pass voltage and the verify pass voltage.

FIG. 2 is a diagram illustrating threshold voltage distributions of triple-level cells (TLC). In FIG. 2, Vth may represent a magnitude of voltage.

Referring to FIG. 2, data patterns stored in TLCs and threshold voltage distributions of target program states corresponding to the data patterns are illustrated by way of an example. Each TLC may store 3 bits of data including a most significant bit (MSB), a central significant bit (CSB), and a least significant bit (LSB). In an example of FIG. 2, a memory cell corresponding to an erase state E may store a data pattern of “0 0 0”, and memory cells corresponding to first to seventh program states PV1 to PV7 may store data patterns of “1 1 1”, “1 1 0”, “0 1 1”, “1 0 1”, “0 0 1”, “0 1 0”, and “1 0 0”, respectively. In order to read data from the TLC, first to seventh read voltages R1 to R7 may be used. Meanwhile, a pass voltage Vpass may be applied to unselected word lines.

During a program verify operation, first to seventh verify voltages Vvf1~Vvf7 may be used. A program-enable voltage may be applied to a bit line coupled to a memory cell having a threshold voltage lower than the first verify voltage Vvf1, among memory cells having the first program state PV1, as a target program state. Also, a program-inhibit voltage may be applied to a bit line coupled to a memory cell having a threshold voltage higher than the first verify voltage Vvf1, among the memory cells having the first program state PV1, as a target program state. Meanwhile, the program-enable voltage may be applied to a bit line coupled to a memory cell having a threshold voltage lower than the second verify voltage Vvf2, among memory cells having the second program state PV2, as a target program state. Also, a program-inhibit voltage may be applied to a bit line coupled to a memory cell having a threshold voltage higher than the second verify voltage Vvf2, among the memory cells having the second program state PV2, as a target program state. In this way, a bit line voltage may be set for a subsequent program operation by comparing the threshold voltages of memory cells corresponding to each target program state with the corresponding verify voltage.

Figure 3:
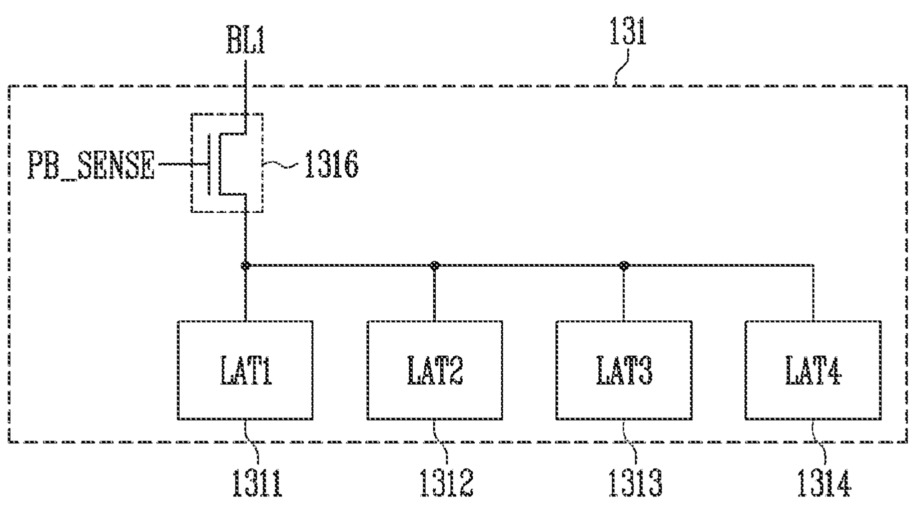
FIG. 3 is a diagram schematically illustrating an example of a page buffer illustrated in FIG. 1.

FIG. 3 is a diagram schematically illustrating an example of the page buffer illustrated in FIG. 1.

In detail, the page buffer 131 may be an embodiment of the page buffer PB1 coupled to a first bit line BL1, among the page buffers PB1 to PBm, illustrated in FIG. 1. Other page buffers PB2 to PBm may also have the same configuration as the page buffer 131, illustrated in FIG. 3.

Referring to FIG. 3, the page buffer 131 may include a plurality of latches 1311, 1312, and 1313, which store program data input from an external device during a program operation. For example, in an embodiment illustrated in FIG. 3, the page buffer 131 may store 3 bits of data. In this case, the first latch LAT1 1311 may store an MSB, the second latch LAT2 1312 may store a CSB, and the third latch LAT3 1313 may store an LSB. Until programming of the memory cell coupled to the first bit line BL1 is completed, the first, second, and third latches 1311, 1312, and 1313 may maintain data patterns stored therein.

Meanwhile, the page buffer 131 may further include a fourth latch LAT4 1314. The fourth latch LAT4 1314 may be used for an operation of sensing the first bit line BL1 to verify the memory cell coupled to the first bit line BL1.

Meanwhile, the page buffer 131 may include a bit line connection transistor 1316 that controls connections between the first bit line BL1 and the latches 1311, 1312, 1313, and 1314. The bit line connection transistor 1316 may be controlled in response to a bit line connection signal PB_SENSE. For example, when data is read from the memory cell, the bit line connection transistor 1316 may be turned on, thus electrically connecting the first bit line BL1 to the fourth latch 1314.

The program operation on the memory cell may include a plurality of program loops. Each program loop may include the step of increasing the threshold voltages of memory cells by applying a program voltage to a selected word line and the step of verifying the threshold voltages of the memory cells.

As programming progresses, when the threshold voltage of the memory cell coupled to the first bit line BL1 becomes higher than a verify voltage corresponding to a target program state, a data pattern stored in the first to third latches 1311 to 1313 may be changed to a data pattern corresponding to the erase state E. For example, as described above with reference to FIG. 2, the data pattern corresponding to the erase state E is “0 0 0”, and thus, the data pattern stored in the first latch 1311, the second latch 1312, and the third latch 1313 may be changed to “0 0 0”. When the data pattern stored in the first latch 1311, the second latch 1312, and the third latch 1313 are “0 0 0”, a program-inhibit voltage may be applied to the first bit line BL1 when a program pulse is applied in a subsequent program loop. Accordingly, in the subsequent program loop, the threshold voltage of the memory cell coupled to the first bit line BL1 may be maintained.

Hereinafter, a description will be made in detail with reference to FIGS. 4A to 4B.

Figure 4A:
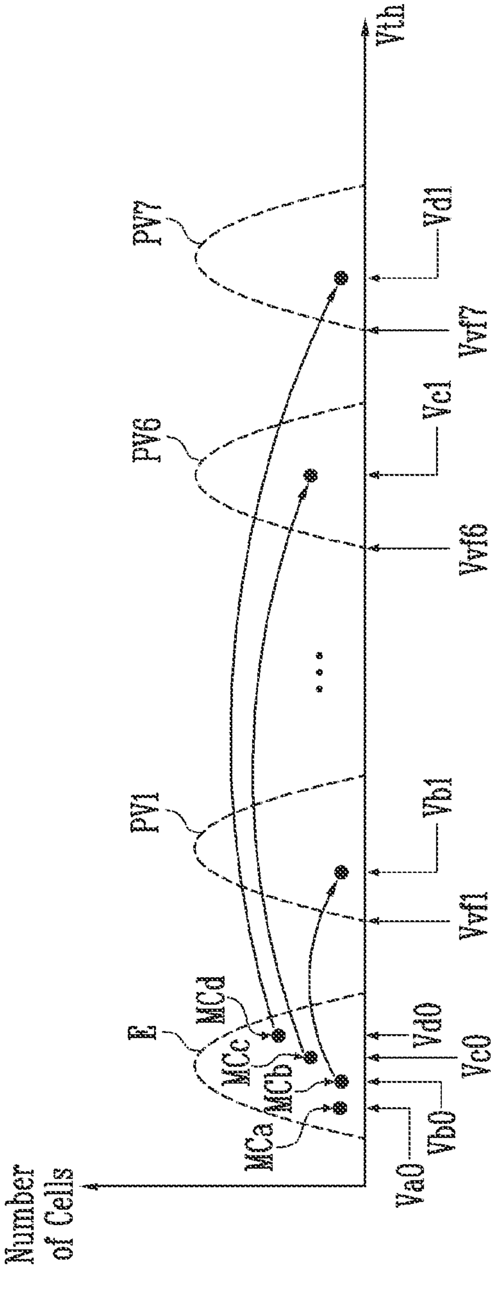

FIGS. 4A and 4B are diagrams for explaining the threshold voltages of memory cells corresponding to an erase state E and first to seventh program states PV1 to PV7 and data stored in latches. In detail, FIG. 4A illustrates the threshold voltages of memory cells MCa, MCb, MCc, and MCd corresponding to the erase state E and first, sixth, and seventh program states PV1, PV6, and PV7, and FIG. 4B illustrates data stored in latches LAT1 to LAT3 in each of page buffers respectively coupled to the memory cells MCa, MCb, MCc, and MCd corresponding to the erase state E and the first, sixth, and seventh program states PV1, PV6, and PV7.

Referring to FIG. 4A, the threshold voltage of the memory cell MCa in which the data pattern “0 0 0” corresponding to the erase state E is to be stored is illustrated. Initially, the threshold voltage of the memory cell MCa is Va0. Meanwhile, referring to FIG. 4B, data of “0 0 0” may be stored in the first to third latches 1311 to 1313 in the page buffer coupled to the memory cell MCa. As described above, when the data pattern stored in the first to third latches 1311 to 1313 is “0 0 0”, the threshold voltage of the memory cell may be maintained in a subsequent program loop. Accordingly, although programming progresses, the threshold voltage of the memory cell MCa might not be increased.

Further, referring to FIG. 4A, before a program operation, the threshold voltage of the memory cell MCb may be Vb0, which may belong to the erase state E. A data pattern of “1 1 1” may be stored in the memory cell MCb through the program operation, and thus, the memory cell MCb may have a first program state PV1 as a target program state. In the state in which the threshold voltage of the memory cell MCb is Vb0, the data pattern of “1 1 1” may be stored in the first to third latches 1311 to 1313.

As the program operation progresses, the threshold voltage of the memory cell MCb may gradually increase. As illustrated in FIG. 4A, as the program operation progresses, the threshold voltage of the memory cell MCb may be Vb1. Vb1 may be a higher voltage than a first verify voltage Vvf1.

In this case, the threshold voltage of the memory cell MCb has reached the first program state PV1 that is the target program state, and the threshold voltage no longer needs to be increased. Therefore, the data pattern stored in the first to third latches 1311 to 1313 may be changed to "0 0 0", which is identical to the data pattern corresponding to the erase state E. Consequently, in the state in which the threshold voltage of the memory cell MCb is Vb1, the data pattern "0 0 0" may be stored in the first to third latches 1311 to 1313.

Meanwhile, before the program operation, the threshold voltage of the memory cell MCc may be Vc0, which may belong to the erase state E. A data pattern of "0 1 0" may be stored in the memory cell MCc through the program operation, and thus, the memory cell MCc may have a sixth program state PV6 as a target program state. In the state in which the threshold voltage of the memory cell MCc is Vc0, the data pattern of "0 1 0" may be stored in the first to third latches 1311 to 1313.

As the program operation progresses, the threshold voltage of the memory cell MCc may gradually increase. As illustrated in FIG. 4A, as the program operation progresses, the threshold voltage of the memory cell MCc may be Vc1. Vc1 may be a higher voltage than a sixth verify voltage Vvf6. In this case, the threshold voltage of the memory cell MCc has reached the sixth program state PV6 that is the target program state, and the threshold voltage no longer needs to be increased. Therefore, the data pattern stored in the first to third latches 1311 to 1313 may be changed to "0 0 0", which is identical to the data pattern corresponding to the erase state E. Consequently, in the state in which the threshold voltage of the memory cell MCc is Vc1, the data pattern "0 0 0" may be stored in the first to third latches 1311 to 1313.

Finally, before the program operation, the threshold voltage of the memory cell MCd may be Vd0, which may belong to the erase state E. A data pattern of "1 0 0" may be stored in the memory cell MCd through the program operation, and thus, the memory cell MCd may have a seventh program state PV7 as a target program state. In the state in which the threshold voltage of the memory cell MCd is Vd0, the data pattern of "1 0 0" may be stored in the first to third latches 1311 to 1313.

As the program operation progresses, the threshold voltage of the memory cell MCd may gradually increase. As illustrated in FIG. 4A, as the program operation progresses, the threshold voltage of the memory cell MCd may be Vd1. Vd1 may be a higher voltage than a seventh verify voltage Vvf7. In this case, the threshold voltage of the memory cell MCd has reached the seventh program state PV7 that is the target program state, and the threshold voltage no longer needs to be increased. Therefore, the data pattern stored in the first to third latches 1311 to 1313 may be changed to "0 0 0", which is identical to the data pattern corresponding to the erase state E. Consequently, in the state in which the threshold voltage of the memory cell MCd is Vd1, the data pattern "0 0 0" may be stored in the first to third latches 1311 to 1313.

In this way, the first to third latches LAT1 1311, LAT2 1312, and LAT3 1313 in the page buffer may store the data pattern corresponding to the target program state before the programming of the corresponding memory cell is completed. In FIGS. 4A and 4B, although only the memory cells MCa, MCb, MCc, and MCd corresponding to the erase state E and the first, sixth, and seventh program states PV1, PV6, and PV7 have been described, this description may also be applied to program operations on memory cells corresponding to second to fifth program states PV2 to PV5 in the same manner.

Figure 5:
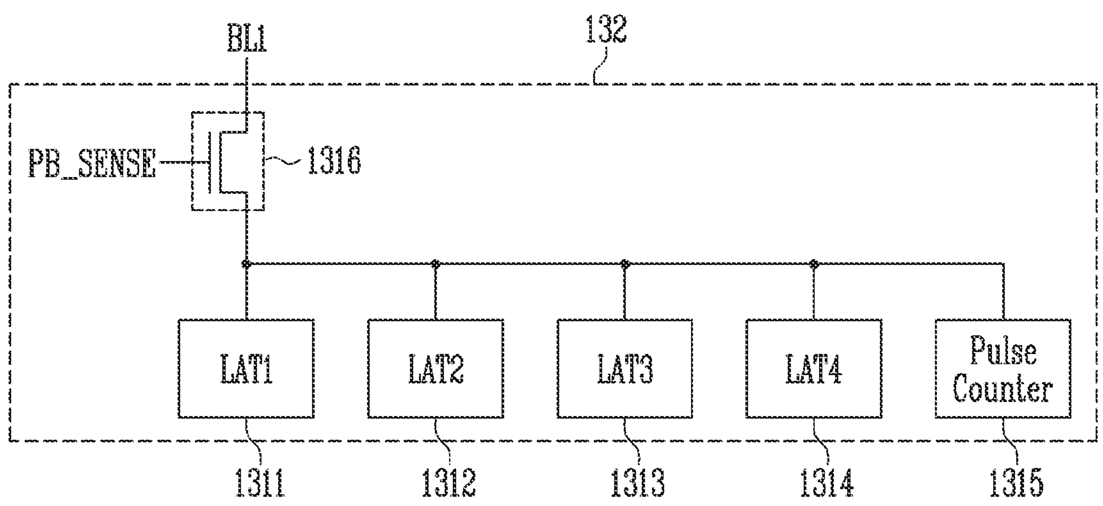
FIG. 5 is a diagram schematically illustrating an example of a page buffer illustrated in FIG. 1.

FIG. 5 is a diagram schematically illustrating an example of the page buffer illustrated in FIG. 1. A page buffer 132 of FIG. 5 may include a plurality of latches 1311, 1312, and 1313, which store program data input from an external device during a program operation, a fourth latch LAT4 1314, which is used for an operation of sensing a first bit line BL1 to verify a memory cell coupled to the first bit line BL1, and a bit line connection transistor 1316, which controls connections between the first bit line BL1 and the latches 1311, 1312, 1313, and 1314. Because the latches 1311, 1312, 1313, and 1314 and the bit line connection transistor 1316, illustrated in FIG. 5, have been described above with reference to FIG. 3, repeated descriptions thereof will be omitted.

Meanwhile, the page buffer 132 of FIG. 5 may further include a pulse counter 1315, which counts the number of blind program pulses applied to the corresponding memory cell. In an embodiment of the present disclosure, a blind program operation may be performed on memory cells having a highest program state, among a plurality of program states, as a target program state. For example, during a program operation on memory cells implemented as TLCs, a seventh program state PV7 may be the highest program state. In this case, instead of performing a verify operation using a seventh verify voltage Vvf7 on memory cells to be programmed to the seventh program state PV7, a blind program loop may be performed a preset number of times when the threshold voltages of the memory cells to be programmed to the seventh program state PV7 become higher than a sixth verify voltage Vvf6. In the blind program loop, a verify operation might not be performed.

For example, when the preset number of times is 3, three blind program loops may be performed on the memory cells to be programmed to the seventh program state PV7 from a time point at which the threshold voltages of the corresponding memory cells become higher than the sixth verify voltage Vvf6. In this case, whenever each blind program loop is repeated, latches for counting the number of blind program loops that are performed may be required. The pulse counter 1315 may include at least one latch. Before the blind program loop on the memory cell coupled to the first bit line BL1 is performed, the pulse counter 1315 may store a value indicating "0" that is an initial value. Whenever each blind program loop is performed on the memory cell coupled to the first bit line BL1, the value of the pulse counter 1315 may be updated. The number of latches included in the pulse counter 1315 may be determined depending on the preset number of blind program loops to be performed.

In an example, as in the case of the above-described example, when a design is made such that three blind program loops are performed on the corresponding memory cells to be programmed to the seventh program state PV7 from the time point at which the threshold voltages of the corresponding memory cells become higher than the sixth verify voltage Vvf6, the pulse counter 1315 may need to include latches for indicating four different numbers from 0 to 3. Therefore, in this case, the pulse counter 1315 may need to include at least two latches.

In an example, as in the case of the above-described example, when a design is made such that one blind program loop is performed on the corresponding memory cells to be programmed to the seventh program state PV7 from the time point at which the threshold voltages of the corresponding memory cells become higher than the sixth verify voltage Vvf6, the pulse counter 1315 may need to include latches for indicating two different numbers from 0 to 1. Therefore, in this case, the pulse counter 1315 may need to include at least one latch.

In an example, as in the case of the above-described example, when a design is made such that five blind program loops are performed on the corresponding memory cells to be programmed to the seventh program state PV7 from the time point at which the threshold voltages of the corresponding memory cells become higher than the sixth verify voltage Vvf6, the pulse counter 1315 may need to include latches for indicating six different numbers from 0 to 5. Therefore, in this case, the pulse counter 1315 may need to include at least three latches.

Figure 6:
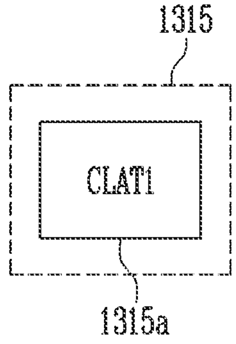
FIG. 6 is a block diagram illustrating an embodiment of a pulse counter of FIG. 5.

FIG. 6 is a block diagram illustrating an embodiment of the pulse counter of FIG. 5.

Referring to FIG. 6, an embodiment in which the pulse counter 1315 includes one counting latch CLAT1 1315*a* is illustrated. As described above, when a design is made such that one blind program loop is performed on the corresponding memory cells to be programmed to the seventh program state PV7 from the time point at which the threshold voltages of the corresponding memory cells become higher than the sixth verify voltage Vvf6, the pulse counter 1315 may need to include latches for indicating two different numbers from 0 to 1. Therefore, in this case, the pulse counter 1315 may need to include at least one latch. That is, in FIG. 6, the pulse counter 1315 that is used when one blind program loop is performed on each of the memory cells to be programmed to the seventh program state PV7 is illustrated. However, this is only an example, and the pulse counter 1315 may include various numbers of counting latches depending on the number of blind program loops that are performed, as described above. Hereinafter, a semiconductor memory device for performing one blind program loop on each TLC will be described with reference to FIGS. 7 to 11B.

Figure 7:
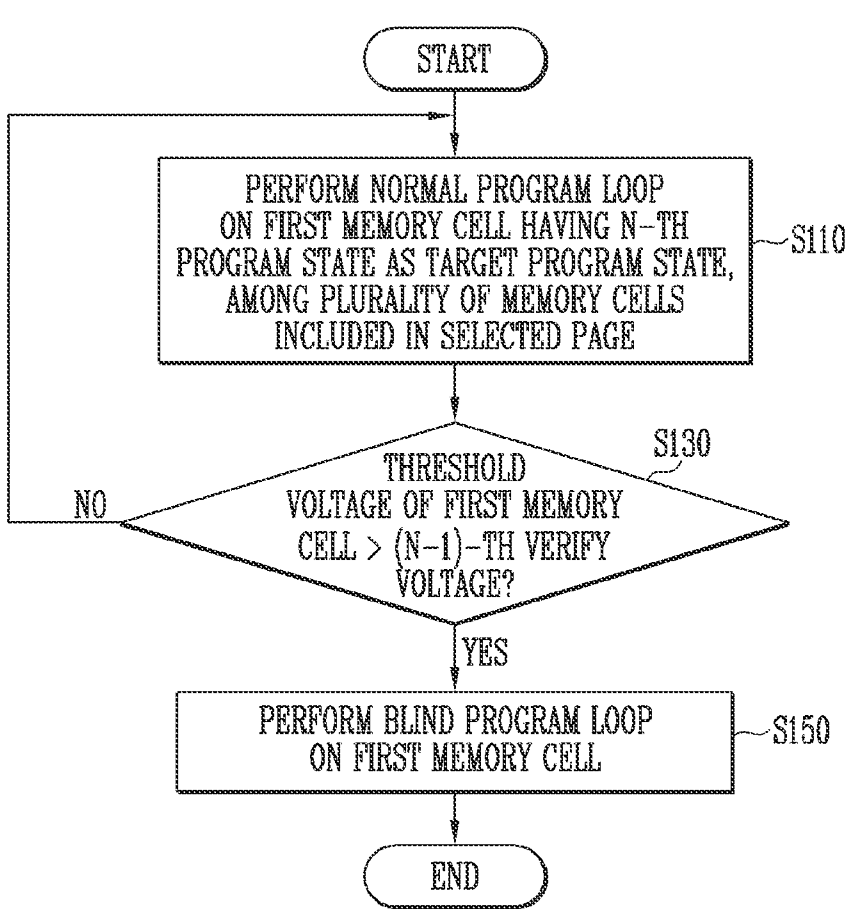
FIG. 7 is a flowchart illustrating a method of operating a semiconductor memory device according to an embodiment of the present disclosure.

FIG. 7 is a flowchart illustrating a method of operating a semiconductor memory device according to an embodiment of the present disclosure.

Referring to FIG. 7, the method of operating a semiconductor memory device according to an embodiment of the present disclosure may include performing a normal program loop on a first memory cell having an N-th program state as a target program state, among a plurality of memory cells included in a selected page at step S110, determining whether the threshold voltage of the first memory cell is higher than an (N−1)-th verify voltage at step S130, and performing a blind program loop on the first memory cell at step S150. In FIG. 7, the present disclosure is illustrated based on the first memory cell having the N-th program state as the target program state, among the memory cells selected as the target of programming. However, it is apparent that the programming of memory cells other than the first memory cell, among the selected memory cells, may also be performed in parallel with the programming of the first memory cell.

At step S110, a normal program loop may be performed on the first memory cell having the N-th program state as the target program state, among the plurality of memory cells included in the selected page. In detail, step S110 may include the step of applying a program voltage to a word line coupled to the selected page in the state in which a program-enable voltage is applied to a bit line coupled to the first memory cell and the step of performing a verify operation on the first memory cell by using an (N−1)-th verify voltage.

In an embodiment, when each of the plurality of memory cells included in the selected page is a TLC, the N-th program state may be a seventh program state PV7, which is the highest program state for a TLC. In this case, the (N−1)-th verify voltage may be a sixth verify voltage Vvf6. In an embodiment, when each of the plurality of memory cells included in the selected page is a multi-level cell (MLC), the N-th program state may be a third program state PV3, which is the highest program state for an MLC. In this case, the (N−1)-th verify voltage may be a second verify voltage Vvf2. Below, the case in which each of the plurality of memory cells included in the selected page is the TLC will be described by way of an example.

At step S110, a verify operation using the sixth verify voltage may be performed on the first memory cell having the seventh program state as the target program state. Thereafter, at step S130, whether the threshold voltage of the first memory cell is higher than the (N−1)-th verify voltage as a result of the verify operation may be determined. When the threshold voltage of the first memory cell is not higher than the (N−1)-th verify voltage (in the case of No at step S130), the process may return to step S110 at which the normal program loop on the first memory cell may be performed again.

When the threshold voltage of the first memory cell is higher than the (N−1)-th verify voltage, a blind program loop may be performed on the first memory cell at step S150. In a detailed example, when the first memory cell is a TLC and the threshold voltage of the first memory cell is higher than the sixth verify voltage, a blind program loop may be performed on the first memory cell. As described above, in the blind program loop at step S150, instead of performing a verify operation using the seventh verify voltage, a program voltage may be applied to the first memory cell a preset number of times. A detailed embodiment of step S150 will be described below with reference to FIG. 8.

Figure 8:
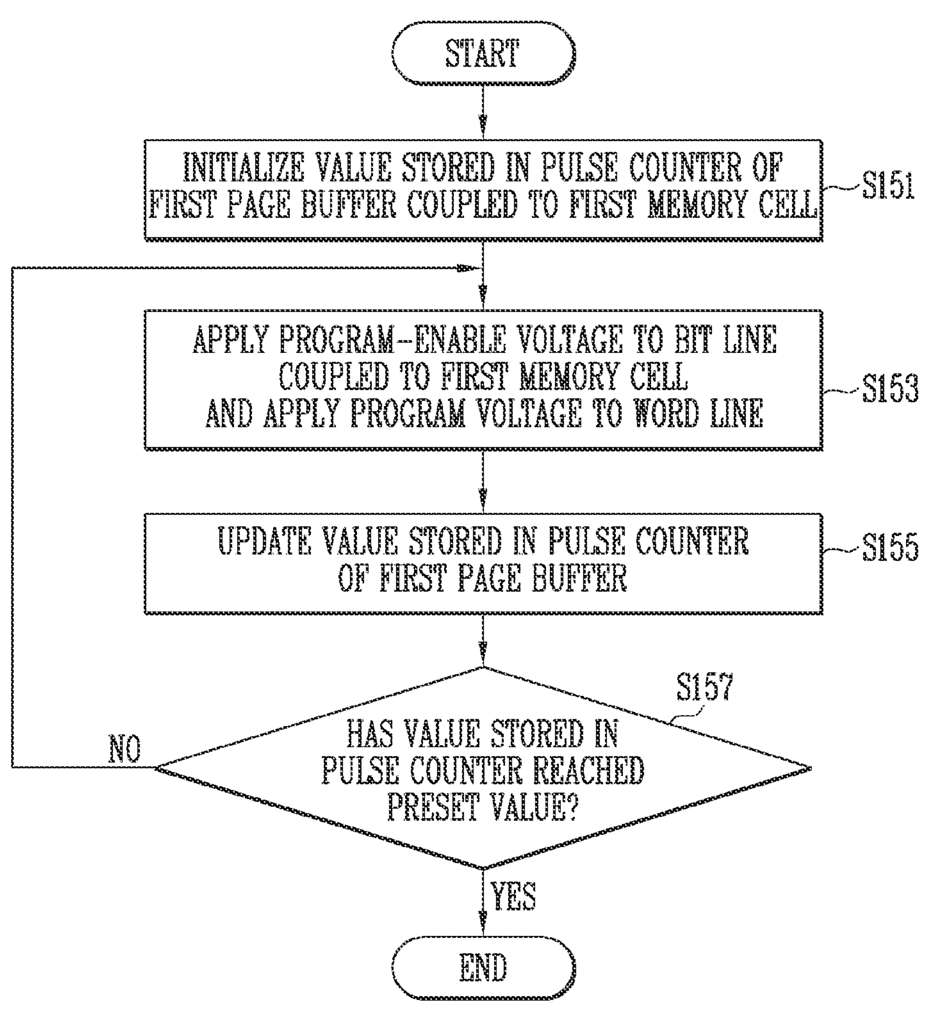
FIG. 8 is a flowchart illustrating an embodiment of step S150 of FIG. 7.

FIG. 8 is a flowchart illustrating an embodiment of step S150 of FIG. 7.

Referring to FIG. 8, step S150 of FIG. 7 may include initializing a value stored in a pulse counter of a first page buffer coupled to the first memory cell at step S151, applying a program-enable voltage to the bit line coupled to the first memory cell and applying a program voltage to the word line at step S153, updating the value stored in the pulse counter of the first page buffer at step S155, and determining whether the value stored in the pulse counter has reached a preset value at step S157.

At step S151, the value stored in the pulse counter of the first page buffer coupled to the first memory cell having the N-th program state as the target program state may be initialized. In an embodiment, at step S151, a value indicating "0" may be stored in the pulse counter of the first page buffer.

At step S153, the program-enable voltage may be applied to the bit line coupled to the first memory cell, and the program voltage may be applied to the word line, thus increasing the threshold voltage of the first memory cell. That is, at step S153, a blind program loop may be performed on the first memory cell.

At step S155, the value stored in the pulse counter of the first page buffer coupled to the first memory cell may be updated. Because the blind program loop has been performed on the first memory cell at step S153, the value indicating the number of blind program loops that are performed may be updated at step S155. In an example, the value stored in the pulse counter of the first page buffer may be changed from "0" to "1" at step S155.

At step S157, whether the value stored in the pulse counter has reached the preset value may be determined. When it is determined that the value stored in the pulse counter has not reached the preset value (in the case of No at step S157), the process may return to step S153 at which the blind program loop may be performed again. When it is determined that the value stored in the pulse counter has reached the preset value (in the case of Yes at step S157), programming on the first memory cell may be terminated.

As described above, the preset value at step S157 may be set in various manners. When the preset value is "1", one blind program loop may be performed on the first memory cell, after which programming on the first memory cell may be terminated. In this case, the pulse counter may include only one count latch.

In an example, when the present value is "3", three blind program loops are performed on the first memory cell, after which programming on the first memory cell may be terminated. In this case, the pulse counter may include at least two count latches.

Figures 9A, 9B:
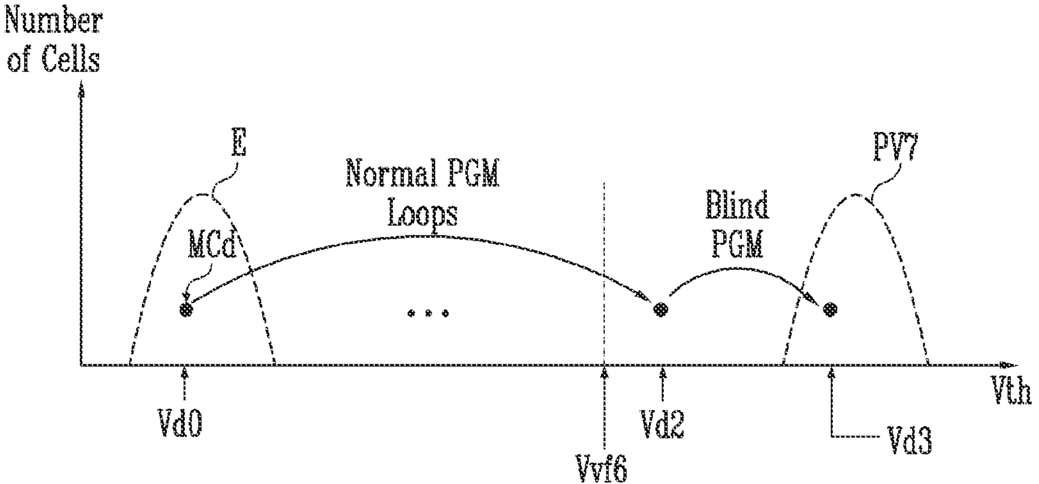
FIGS. 9A and 9B are diagrams for explaining the threshold voltages of memory cells corresponding to a seventh program state PV7 and data stored in latches during a blind program operation according to an embodiment of the present disclosure.

FIGS. 9A and 9B are diagrams for explaining the threshold voltages of memory cells corresponding to a seventh program state PV7 and data stored in latches during a blind program operation according to an embodiment of the present disclosure. Hereinafter, a description will be made in detail with reference to FIGS. 7, 8, 9A, and 9B.

FIG. 9A illustrates a change in the threshold voltage of a memory cell MCd having a seventh program state PV7 as a target program state, and FIG. 9B illustrates changes in data stored in latches LAT1, LAT2, LAT3, and CLAT1 in a page buffer coupled to the memory cell MCd having the seventh program state PV7 as the target program state.

Referring to FIG. 9A, before a program operation, the threshold voltage of the memory cell MCd may be Vd0, which may belong to an erase state E. A data pattern of "1 0 0" may be stored in the memory cell MCd through a program operation, and thus, the memory cell MCd may have the seventh program state PV7 as the target program state. In the state in which the threshold voltage of the memory cell MCd is Vd0, the data pattern of "1 0 0" may be stored in the first to third latches LAT1 to LAT3. Meanwhile, in the count latch CLAT1 in the pulse counter, a data bit of "0" may be stored.

As the normal program loop at step S110 of FIG. 7 is repeatedly performed, the threshold voltage of the memory cell MCd may gradually increase. As illustrated in FIG. 9A, as the program operation progresses, the threshold voltage of the memory cell MCd may be Vd2. Vd2 may be a higher voltage than a sixth verify voltage Vvf6. Because the threshold voltage of the memory cell MCd is higher than the sixth verify voltage Vvf6 (in the case of Yes at step S130), a blind program loop may be performed on the memory cell MCd at step S150.

First, the value stored in the count latch CLAT1 in the pulse counter may be initialized at step S151. Referring to FIG. 9B, it can be seen that the value stored in the count latch CLAT1 is already initialized to "0" in the state in which the normal program loop is performed.

Thereafter, the blind program loop may be performed on the memory cell MCd by applying the program-enable voltage to the bit line coupled to the memory cell MCd and applying the program voltage to the word line at step S153. Accordingly, the threshold voltage of the memory cell MCd may be increased from Vd2 to Vd3.

Thereafter, the value stored in the pulse counter in the page buffer coupled to the memory cell MCd may be updated at step S155. In detail, at step S155, the value of the count latch CLAT1 may be changed from "0" to "1".

Thereafter, whether the value stored in the pulse counter has reached the preset value may be determined. In the example illustrated in FIGS. 9A and 9B, the preset value may be "1." That is, because the value of the count latch CLAT1 has reached the preset value (in the case of Yes at step S157), the program operation on the memory cell MCd may be terminated. Therefore, the data pattern stored in the first to third latches LAT1 1311, LAT2 1312, and LAT3 1313 may be changed to "0 0 0", which is identical to the data pattern corresponding to the erase state E (see the last row in the table of FIG. 9B).

The performance of one blind program loop illustrated in FIGS. 9A and 9B is merely an example. That is, the number of blind program loops that are performed may be variously set. However, as the preset value for the number of blind program loops that are performed increases, the number of count latches included in the pulse counter may also increase. Because each of the page buffers coupled to respective bit lines includes a pulse counter, a physical area or volume occupied by the entire read and write circuit may increase when the number of count latches increases. This is the cause of increasing cost required to manufacture semiconductor memory devices.

In accordance with an embodiment of the present disclosure, a data pattern in a lower program state for which programming has already been completed may be utilized, instead of a separate pulse counter being provided to count the number of blind program operations performed on a memory cell having a highest program state as a target program state. That is, the blind program operation may be performed by using the page buffer 131, illustrated in FIG. 3, rather than in FIG. 5. Accordingly, in an embodiment in which the blind program loop is performed after the normal program loop is performed, the page buffer does not need to include an additional count latch other than the data latches. Consequently, the physical area or volume occupied by the entire read and write circuit may be reduced, and the cost required to manufacture semiconductor memory devices may also be decreased. Hereinafter, a description will be made with reference to FIGS. 10 to 11B.

Figure 10:
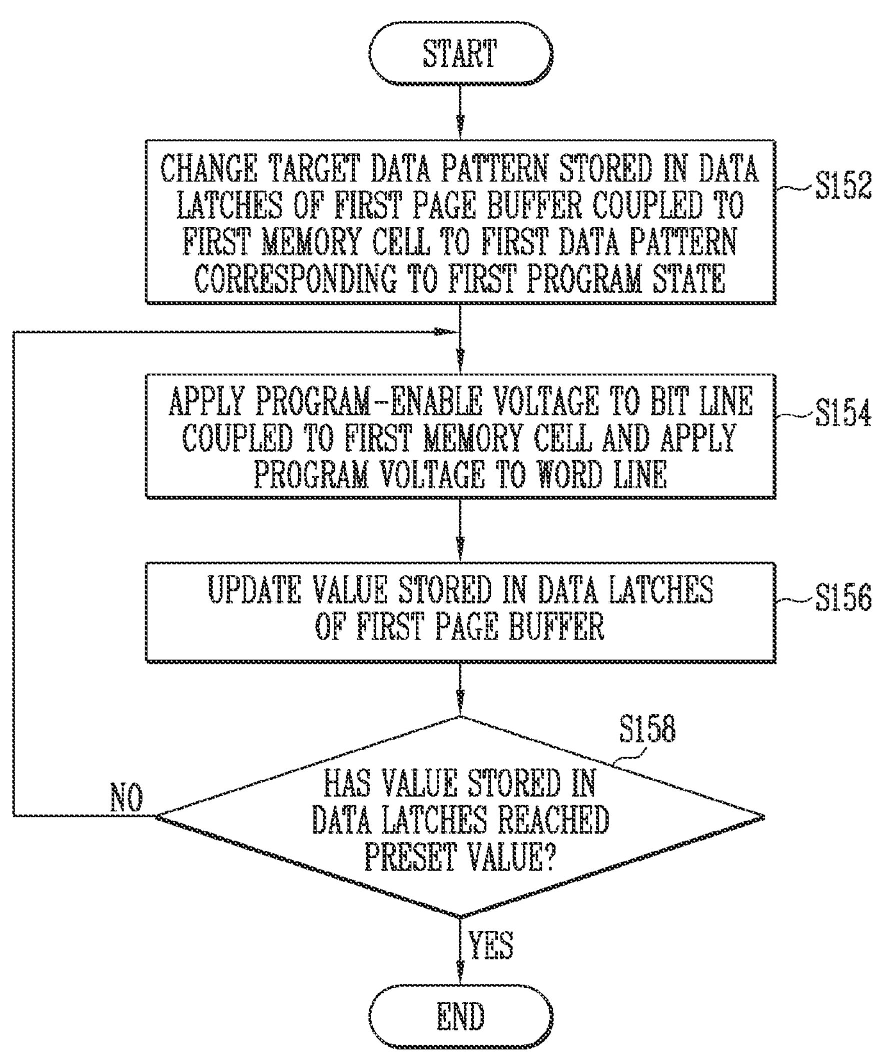
FIG. 10 is a flowchart illustrating an embodiment of step S150 of FIG. 7.
Figures 11A, 11B:
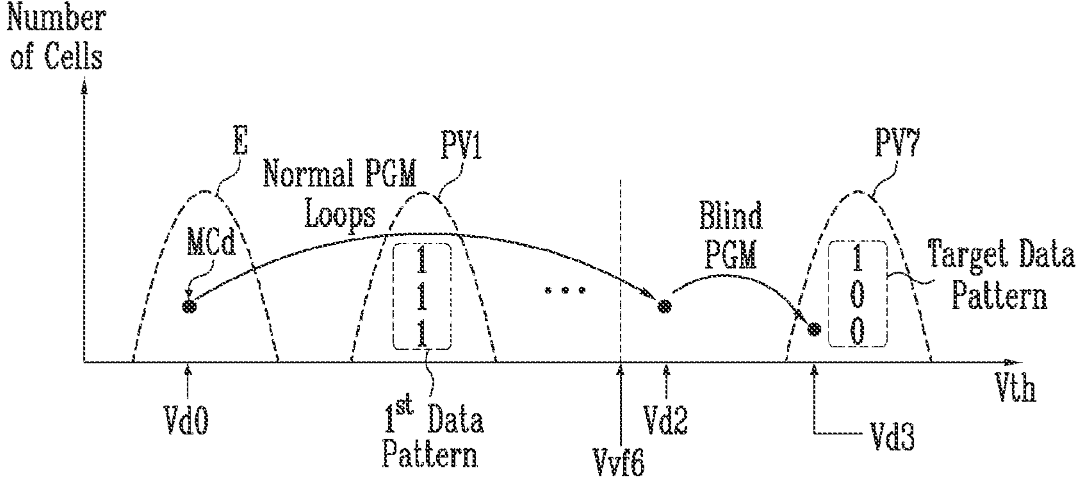
FIGS. 11A and 11B are diagrams for explaining the threshold voltages of memory cells corresponding to a seventh program state PV7 and data stored in latches during a blind program operation according to an embodiment of the present disclosure.

FIG. 10 is a flowchart illustrating an embodiment of step S150 of FIG. 7. Meanwhile, FIGS. 11A and 11B are diagrams for explaining the threshold voltages of memory cells corresponding to a seventh program state PV7 and data stored in latches during a blind program operation according to an embodiment of the present disclosure. Hereinafter, an embodiment of step S150 will be described in detail with reference to FIGS. 7, 8, 11A, and 11B together with FIG. 10.

Referring to FIGS. 7 and 11A, the step S110 of performing a normal program loop on the first memory cell having the seventh program state PV7 as the target program state is substantially the same as that described with reference to FIG. 9A. That is, when the threshold voltage of the memory cell MCd is lower than the sixth verify voltage Vvf6 (in the case of No at step S130), normal program loops may be repeatedly performed at step S110.

When the threshold voltage of the first memory cell having the seventh program state PV7 as the target program state is higher than the sixth verify voltage (in the case of Yes at step S130), the blind program loop on the first memory cell may be performed at step S150.

Referring to FIG. 10, step S150 of FIG. 7 may include changing a target data pattern, stored in the data latches of the first page buffer coupled to the first memory cell, to a first data pattern at step S152, applying a program-enable voltage to the bit line coupled to the first memory cell and applying a program voltage to the word line at step S154, updating the value stored in the data latches of the first page buffer at step S156, and determining whether the value stored in the data latches has reached a preset value at step S158.

At step S152, the target data pattern stored in the data latches of the first page buffer coupled to the first memory cell having the N-th program state as the target program state may be changed to a first data pattern corresponding to a first program state PV1. In an example, in a program operation on a TLC, the N-th program state may be the seventh program state PV7. That is, at step S152, the target data pattern, that is, "1 0 0", which is stored in the data latches LAT1, LAT2, and LAT3 of the first page buffer coupled to the first memory cell having the seventh program state PV7 as the target program state, may be changed to the first data pattern, that is, "1 1 1", corresponding to the first program state PV1.

Referring to FIGS. 11A and 11B, when the threshold voltage of the memory cell MCd is Vd2, the data pattern stored in the data latches LAT1, LAT2, and LAT3 in the page buffer coupled to the memory cell MCd may be changed from "1 0 0", which is the target data pattern, to "1 1 1", which is the first data pattern, at step S152.

Referring back to FIG. 7, it can be seen that step S150 is performed when the threshold voltage of the first memory cell having the seventh program state PV7 as the target program state is higher than the second verify voltage (in the case of Yes at step S130). When the deviation between program speeds of memory cells included in the selected page is not extremely large, programming of all memory cells having the first program state PV1 as the target program state would have been completed at the time point at which step S150 is performed.

That is, at the time point at which step S150 begins, a verify operation for the first program state PV1 would have passed. This means that the threshold voltages of all of the memory cells having the first program state PV1 as the target program state, for example, the memory cells MCb illustrated in FIG. 4A, become higher than the first verify voltage Vvf1. In this case, as described above with reference to FIG. 4B, the data pattern of all of the first, second, and third latches LAT1 1311, LAT2 1312, and LAT3 1313 in the page buffer coupled to the memory cells having the first program state PV1 as the target program state may be changed to "0 0 0." In other words, all of the latches corresponding to the memory cell MCb in the selected page, that is, the first, second, and third latches LAT1 1311, LAT2 1312, and LAT3 1313, which initially store the data pattern of "1 1 1", may store the data pattern of "0 0 0."

Therefore, referring to step S150 of FIG. 7, the data pattern stored in the data latches LAT1, LAT2, and LAT3 of the page buffer coupled to memory cells, the threshold voltages of which become higher than the sixth verify voltage Vvf6, among the memory cells MCd having the seventh program state PV7 as the target program state, may be changed from "1 0 0" to "1 1 1" at step S152 of FIG. 10.

Programming of all the memory cells MCb having the first program state PV1 as the target program state has been completed. Thus, even if the data pattern of first to third latches LAT1 to LAT3 corresponding to a memory cell having a threshold voltage higher than the sixth verify voltage Vvf6, among memory cells MCd to be programmed to the seventh program state PV7, is changed to "1 1 1", the memory cell MCd having the changed data pattern is not confused with the memory cells MCb having the first program state PV1 as the target program state. As described above, the reason for this is that the data pattern of the first to third latches LAT1 to LAT3 corresponding to all of the memory cells MCb having the first program state PV1 as the target program state has changed to "0 0 0." Through this process, the number of blind program loops performed on each memory cell MCd may be counted.

Thereafter, at step S154, the blind program loop may be performed by applying a program-enable voltage to the bit line coupled to the first memory cell and applying a program voltage to the word line. By performing step S154, the threshold voltage of the memory cell MCd may be increased from Vd2 to Vd3, as illustrated in FIG. 11A.

Thereafter, at step S156, the value stored in the data latches of the first page buffer may be updated. As illustrated in FIG. 11B, the data pattern stored in the first to third latches LAT1 to LAT3 in the page buffer coupled to the memory cell MCd on which one blind program loop is performed may be changed from "1 1 1" to "0 0 0."

Subsequently, at step S158, whether the value stored in the data latches has reached a preset value may be determined. In an embodiment illustrated in FIG. 11B, the preset value may be "0 0 0." Therefore, because the value stored in the data latches has reached the preset value (in the case of Yes at step S158), the blind program operation on the memory cell MCd may be terminated.

In a blind program process performed on the TLC illustrated in FIGS. 10, 11A, and 11B, a data pattern of "1 1 1" corresponding to a lower program state PV1 for which programming has already been completed may be utilized, instead of a separate pulse counter being provided so as to count the number of blind program operations performed on the memory cell having the highest program state PV7 as a target program state. Accordingly, in an embodiment in which the blind program loop is performed after the normal program loop is performed, the page buffer does not need to include an additional count latch other than the data latches. Consequently, the physical area or volume occupied by the entire read and write circuit may be reduced, and the cost required to manufacture semiconductor memory devices may also be decreased.

This method may be applied not only to programming of a TLC but also to programming of a MLC. However, during a blind program operation on the MLC, it is difficult to increase the number of blind program loops performed on a memory cell having a threshold voltage higher than a second verify voltage Vvf2. The reason for this is that programming for only the first program state PV1 would have been completed at a time point at which the threshold voltage of the memory cell having a highest program state PV3 as a target program state exceeds the second verify voltage Vvf2. That is, the data pattern that is actually usable in the blind program operation on the MLC is limited to one data pattern corresponding to the first program state PV1. Therefore, the number of blind program operations may substantially be limited to one.

However, when the present disclosure is applied to a TLC, a quad-level cell (QLC), or a memory cell which stores 5 or more bits, the number of data patterns usable to count the number of blind program loops is increased, and thus, the number of blind program loops that are performed may also be more flexibly set. Hereinafter, a description will be made with reference to FIGS. 12A and 12B.

Figure 12A:
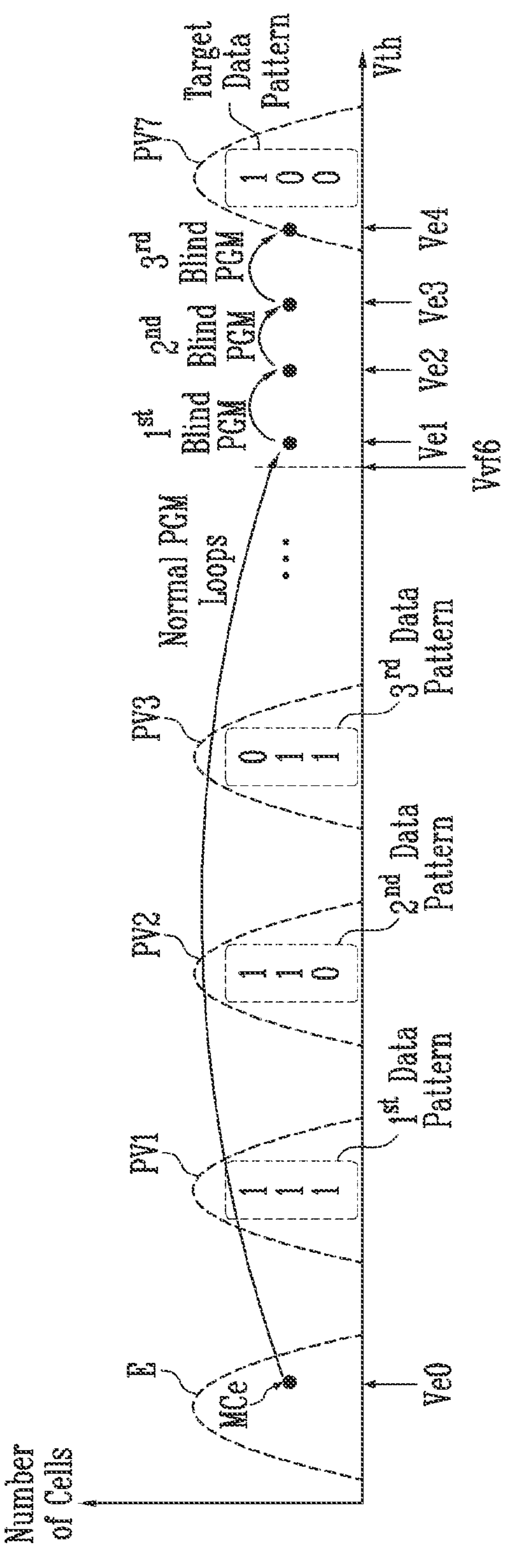

FIGS. 12A and 12B are diagrams for explaining the threshold voltages of memory cells corresponding to a seventh program state PV7 and data stored in latches during a blind program operation according to an embodiment of the present disclosure.

Referring to FIGS. 7 and 12A, before a program operation, the threshold voltage of the memory cell MCe may be Ve0, which may belong to an erase state E. A normal program loop may be performed on a first memory cell having the seventh program state PV7 as a target program state at step S110. As described above, when the threshold voltage of the first memory cell having the seventh program state PV7 as the target program state, that is, a memory cell MCe, among memory cells included in the selected page, is lower than the sixth verify voltage Vvf6 (in the case of No at step S130), normal program loops may be repeatedly performed at step S110.

When the threshold voltage of the first memory cell having the seventh program state PV7 as the target program state is higher than the sixth verify voltage (in the case of Yes at step S130), the blind program loop on the first memory cell may be performed at step S150.

Referring to FIGS. 12A and 12B, when the threshold voltage of the memory cell MCe is Ve1, the data pattern stored in data latches LAT1, LAT2, and LAT3 in the page buffer coupled to the memory cell MCe may be changed from "1 0 0", which is the target data pattern, to "1 1 1", which is the first data pattern, at step S152.

Referring back to FIG. 7, it can be seen that step S150 is performed when the threshold voltage of the first memory cell having the seventh program state PV7 as the target program state is higher than the sixth verify voltage Vvf6 (in the case of Yes at step S130). When the deviation between program speeds of memory cells included in the selected page is not extremely large, programming of all memory cells having a first program state PV1 as the target program state would have been completed at the time point at which step S150 is performed.

That is, at the time point at which step S150 begins, a verify operation for the first program state PV1 would have passed. This means that all of the threshold voltages of the memory cells having the first program state PV1 as the target program state become higher than the first verify voltage Vvf1. In this case, the data pattern of the first, second, and third latches LAT1, LAT2, and LAT3 in the page buffer coupled to the memory cells having the first program state PV1 as the target program state may be changed to "0 0 0." In other words, the data pattern of "0 0 0" may be stored in the first to third latches LAT1, LAT2, and LAT3, which initially store the first data pattern of "1 1 1" in the selected page.

Therefore, referring to step S150 of FIG. 7, the data pattern stored in the data latches LAT1, LAT2, and LAT3 of the page buffer coupled to memory cells, the threshold voltages of which become higher than the sixth verify voltage Vvf6, among the memory cells MCe having the seventh program state PV7 as the target program state, may be changed from "1 0 0" to "1 1 1" at step S152 of FIG. 10.

Thereafter, at step S154, a blind program loop may be performed by applying a program-enable voltage to the bit line coupled to the first memory cell and applying a program voltage to the word line. By performing step S154, the threshold voltage of the memory cell MCe may be increased from Ve1 to Ve2, as illustrated in FIG. 12A.

Thereafter, at step S156, the value stored in the data latches of the first page buffer may be updated. As illustrated in FIG. 12B, the data pattern stored in the first to third latches LAT1, LAT2, and LAT3 in the page buffer coupled to the memory cell MCe on which one blind program loop is performed may be changed from "1 1 1" to "1 1 0." Similar to the first program state PV1, a verify operation for a second program state PV2 would have passed at the time point at which step S150 begins. Therefore, a second data pattern of "1 1 0" corresponding to the second program state PV2 may also be used to count a blind program loop. The case in which the second data pattern of "1 1 0" is stored in the data latches LAT1, LAT2, and LAT3 at step S150 may mean that one blind program operation has been performed on the memory cell.

Subsequently, at step S158, whether the value stored in the data latches has reached a preset value may be determined. In an embodiment illustrated in FIG. 12B, the preset value may be "0 0 0." Therefore, because the value stored in the data latches has not reached the preset value (in the case of No at step S158), the process may return to step S154 at which a blind program loop is performed again. At step S154, a second blind program loop is performed, after which the value stored in the data latches LAT1, LAT2, and LAT3 of the first page buffer may be updated at step S156. By performing step S154, the threshold voltage of the memory cell MCe may be increased from Ve2 to Ve3, as illustrated in FIG. 12A.

In detail, the data pattern stored in the data latches LAT1, LAT2, and LAT3 in the page buffer coupled to the memory cell MCe on which two blind program loops are performed may be changed from "1 1 0" to "0 1 1." Similar to the first and second program states PV1 and PV2, a verify operation for a third program state PV3 would have passed at the time point at which step S150 begins. Therefore, a third data pattern of "0 1 1" corresponding to the third program state PV3 may also be used to count a blind program loop. The case in which the third data pattern of "0 1 1" is stored in the data latches LAT1, LAT2, and LAT3 at step S150 may mean that two blind program operations have been performed on the memory cell.

Subsequently, at step S158, whether the value stored in the data latches has reached the preset value may be determined. In an embodiment, illustrated in FIG. 12B, the preset value may be "0 0 0." Therefore, because the value stored in the data latches has not reached the preset value (in the case of No at step S158), the process may return to step S154 at which a blind program loop is performed again. At step S154, a third blind program loop may be performed, after which the value stored in the data latches LAT1, LAT2, and LAT3 of the first page buffer may be updated at step S156. By performing step S154, the threshold voltage of the memory cell MCe may be increased from Ve3 to Ve4, as illustrated in FIG. 12A.

In detail, the data pattern stored in the data latches LAT1, LAT2, and LAT3 in the page buffer coupled to the memory cell MCe on which three blind program loops are performed may be changed from "0 1 1" to "0 0 0." Subsequently, at step S158, whether the value stored in the data latches has reached the preset value may be determined. The preset value may be "0 0 0." Therefore, because the data value stored in the data latches has reached the preset value (in the case of Yes at step S158), the blind program operation on the memory cell MCe may be terminated.

In a blind program process on the TLC, illustrated in FIGS. 10, 12A, and 12B, data patterns "1 1 1", "1 1 0", and "0 1 1" corresponding to the lower program states PV1, PV2, and PV3 for which programming has already been completed may be utilized, instead of a separate pulse counter being provided to count the number of blind program operations performed on the memory cell having the highest program state PV7 as a target program state. Accordingly, in an embodiment in which the blind program loop is performed after the normal program loop is performed, the page buffer might not need to include an additional count latch other than the data latches. Consequently, the physical area or volume occupied by the entire read and write circuit may be reduced, and the cost required to manufacture semiconductor memory devices may also be decreased.

Unlike in the blind program operation on the MLC, in the blind program operation on the TLC, it is easy to increase the number of blind program loops performed on a memory cell having a threshold voltage higher than the sixth verify voltage Vvf6. The reason for this is that programming for a relatively large number of lower program states PV1, PV2, and PV3 would have been completed at a time point at which the threshold voltage of the memory cell having the highest program state PV7 as a target program state exceeds the sixth verify voltage Vvf6. When the data patterns for the three lower program states PV1, PV2, and PV3 are used, a maximum of three blind program loops may be counted. Unlike this, when data patterns for the four lower program states PV1, PV2, PV3, and PV4 are used, a maximum of four blind program loops may be counted. That is, the number of available blind program loops that are performed may also be adjusted by controlling the number of lower program states for which data patterns are used as occasion demands. That is, during a program operation performed on a TLC, a QLC, or a memory cell which stores 5 or more bits, the number of data patterns usable to count the number of blind program loops may also be increased, and thus, the number of blind program operations that are performed may be more flexibly set.

The present disclosure may provide a semiconductor memory device, which does not require an additional latch for counting the number of blind program operations, and a method of operating the semiconductor memory device.

What is claimed is:

1. A method of operating a semiconductor memory device, comprising:

performing at least one normal program loop on a first memory cell, among a plurality of memory cells included in a page selected as a program target, having an N-th program state, among a plurality of program states, as a target program state; and performing at least one blind program loop on the first memory cell, wherein, while the at least one blind program loop is being performed, a target data pattern that is stored in a data latch of a first page buffer coupled to the first memory cell and that corresponds to the N-th program state is changed to a first data pattern corresponding to a first program state that is lower than the N-th program state, among the plurality of program states, and wherein N is a natural number equal to or greater than 2.

2. The method according to claim 1, wherein, while the at least one normal program loop is being performed, the data latch of the first page buffer stores the target data pattern corresponding to the N-th program state.

3. The method according to claim 1, wherein a verify operation on the first memory cell is performed in the normal program loop and is not performed in the blind program loop.

4. The method according to claim 1, wherein performing the at least one blind program loop comprises:

changing the target data pattern stored in the data latch of the first page buffer to the first data pattern;

increasing a threshold voltage of the first memory cell by applying a program voltage to a word line coupled to the first memory cell; and updating a value stored in the first page buffer.

5. The method according to claim 4, wherein updating the value stored in the first page buffer comprises:

changing the first data pattern stored in the data latch of the first page buffer to a second data pattern corresponding to a second program state, among the plurality of program states.

6. The method according to claim 5, further comprising:

determining whether the value stored in the data latch has reached a preset value.

7. The method according to claim 6, further comprising:

terminating a program operation on the first memory cell in response to a determination that the value stored in the data latch has reached the preset value.

8. The method according to claim 6, further comprising:

re-increasing the threshold voltage of the first memory cell by re-applying a program voltage to the word line coupled to the first memory cell in response to a determination that the value stored in the data latch has not reached the preset value; and re-updating the value stored in the first page buffer, wherein N is a natural number equal to or greater than 3.

9. The method according to claim 8, wherein re-updating the value stored in the first page buffer comprises:

changing the first data pattern stored in the data latch of the first page buffer to the second data pattern corresponding to the second program state, among the plurality of program states.

10. The method according to claim 1, further comprising:

after the at least one normal program loop is performed, determining whether the threshold voltage of the first memory cell is higher than a reference voltage, wherein the at least one blind program loop begins in response to a determination that the threshold voltage of the first memory cell is higher than the reference voltage.

11. A semiconductor memory device, comprising:

a plurality of memory cells, each storing M bits;

a plurality of page buffers coupled to the plurality of memory cells through bit lines, respectively, and configured to perform a program operation such that a threshold voltage of each of selected memory cells, among the plurality of memory cells, is included in a corresponding program state, among an erase state and first to $(2^M-1)$-th program states; and a control logic configured to control a first page buffer, among the plurality of page buffers, coupled to a first memory cell corresponding to the $(2^M-1)$-th program state such that, while the program operation is being performed by the plurality of page buffers, a normal program loop is performed on the first memory cell and such that, after the normal program loop is performed, a blind program loop is performed on the first memory cell, wherein M is a natural number equal to or greater than 2, wherein while the normal program loop is being performed, a data latch of the first page buffer stores a target data pattern corresponding to the $(2^M-1)$-th program state, and wherein while the blind program loop is being performed, the first page buffer changes the target data pattern stored in the data latch to a first data pattern corresponding to the first program state.

12. The semiconductor memory device according to claim 11, wherein a verify operation on the first memory cell is performed in the normal program loop and is not performed in the blind program loop.

13. The semiconductor memory device according to claim 12, wherein, after a first blind program loop is performed on the first memory cell, the first page buffer changes the first data pattern stored in the data latch to a second data pattern.

14. The semiconductor memory device according to claim 13, wherein the second data pattern is a data pattern corresponding to the erase state, and wherein the control logic controls the first page buffer such that, after the first blind program loop is performed, a program operation on the first memory cell is terminated.

15. The semiconductor memory device according to claim 13, wherein the second data pattern is a data pattern corresponding to a second program state, among the first to $(2^M-1)$-th program states.

16. The semiconductor memory device according to claim 15, wherein, after a second blind program loop is performed on the first memory cell, the first page buffer changes the second data pattern stored in the data latch to a third data pattern.

17. The semiconductor memory device according to claim 16, wherein the third data pattern is a data pattern corresponding to the erase state, and wherein the control logic controls the first page buffer such that, after the second blind program loop is performed, the program operation on the first memory cell is terminated.

18. The semiconductor memory device according to claim 16, wherein the third data pattern is a data pattern corresponding to a third program state, among the first to $(2^M-1)$-th program states.

19. The semiconductor memory device according to claim 11, wherein the control logic controls the first page buffer such that, when a threshold voltage of the first memory cell is lower than a reference voltage, a normal program loop is performed on the first memory cell, and when the threshold voltage of the first memory cell is higher than the reference voltage, a blind program loop is performed on the first memory cell.

20. The semiconductor memory device according to claim 19, wherein the reference voltage is a verify voltage for verifying a $(2^M-2)$-th program state, among the first to $(2^M-1)$-th program states.

* * * * *